United States Patent
Lam

(10) Patent No.: US 7,859,346 B2
(45) Date of Patent: Dec. 28, 2010

(54) CLOCK GENERATOR AND ASSOCIATED SELF-TEST AND SWITCHING-CONTROL METHOD

(75) Inventor: Chris Lam, Rowland Heights, CA (US)

(73) Assignee: MSTAR Semiconductor, Inc., Hsinchu (TW)

( * ) Notice: Subject to any disclaimer, the term of this patent is extended or adjusted under 35 U.S.C. 154(b) by 409 days.

(21) Appl. No.: 11/972,026

(22) Filed: Jan. 10, 2008

(65) Prior Publication Data

US 2008/0211560 A1 Sep. 4, 2008

Related U.S. Application Data

(60) Provisional application No. 60/884,225, filed on Jan. 10, 2007.

(51) Int. Cl.
*G01R 23/00* (2006.01)
*H03L 7/08* (2006.01)

(52) U.S. Cl. .......................... 331/44; 331/74; 331/1 A; 327/156

(58) Field of Classification Search ................. 331/44, 331/10, 11, 16, 4, 74, 1 A; 327/156, 159, 327/115, 117; 324/76.48, 76.47, 76.41
See application file for complete search history.

(56) References Cited

U.S. PATENT DOCUMENTS

| | | | | |
|---|---|---|---|---|
| 5,381,085 | A * | 1/1995 | Fischer | 324/76.48 |
| 5,900,784 | A | 5/1999 | O'Sullivan | |
| 7,205,853 | B2 * | 4/2007 | Miki | 331/44 |
| 7,400,130 | B2 * | 7/2008 | Naujokat et al. | 324/76.62 |
| 7,528,665 | B2 * | 5/2009 | Coppola et al. | 331/2 |
| 2007/0001770 | A1 | 1/2007 | Wang et al. | |

* cited by examiner

*Primary Examiner*—Robert Pascal
*Assistant Examiner*—Ryan Johnson
(74) *Attorney, Agent, or Firm*—Kirton & McConkie; Evan R. Witt

(57) ABSTRACT

A clock generator with extended tuning range and associated method is provided. The associated self-test and switching-control method includes steps of generating a primary clock signal by a phase-locked loop circuit; determining a frequency limit of the primary clock signal; and determining a frequency-dividing condition of the frequency-dividing module according to the frequency limit and the target frequency.

17 Claims, 5 Drawing Sheets

000
CLOCK GENERATOR AND ASSOCIATED SELF-TEST AND SWITCHING-CONTROL METHOD

CROSS REFERENCE TO RELATED PATENT APPLICATION

This patent application claims the benefit of U.S. provisional patent application No. 60/884,225 filed Jan. 10, 2007.

FIELD OF THE INVENTION

The present invention relates to a clock generator, and more particularly to a clock generator with a built-in self-test and frequency band switching control method.

BACKGROUND OF THE INVENTION

A transceiver is commonly used in communication systems, and the performance of a transceiver highly depends on the accuracy of a clock generator inside the transceiver. Particularly for electronic communication products used in the applications of wireless local area network (WLAN), ultra-wideband (UWB), mobile or entertainment systems, high communication quality, high data-transmission rate and more operation bands are required. Therefore, a phase-locked loop (PLL) circuit with a relatively large tuning range is generally used.

Please refer to FIG. 1 which illustrates a conventional PLL circuit. The PLL circuit 101 includes a phase/frequency detector (PFD) 1010, a charge pump 1011, a loop filter 1012 and a voltage control oscillator (VCO) module 1013. The VCO module 1013 generates an output clock signal with a certain frequency in response to a control voltage for external circuits (not shown). The outputted clock signal is fed back to the PFD 1010 to be processed with a reference clock signal. The PFD 1010 then generates a signal indicating a phase/frequency difference between the reference clock signal and the outputted clock signal. Afterwards, the signal is converted into a control voltage through the charge pump 1011 and loop filter 1012 for controlling the VCO module 1013 to generate the clock signal accurately.

The clock signal generated by the above clock generator is applicable to demodulating a data signal received by a modern electronic communication product. The VCO module 1013 plays an important role in the demodulation process. Generally, a plurality of VCOs with somewhat overlapping operational frequencies for the VCO module 1013 are used for covering a wide tuning range. The inclusion of the plural VCOs complicates the circuitry, occupies considerable chip area and consumes power.

SUMMARY OF THE INVENTION

Therefore, the present invention provides a clock generator capable of covering a satisfactory tuning range with a reduced number of VCOs, e.g. a single VCO.

The present invention also provides a self-test and switching-control method for use in a clock generator, which works to allow the clock generator to cover a satisfactory tuning range with a reduced number of VCOs, e.g. a single VCO.

The present invention relates to a clock generator for generating a clock signal with a target frequency, which includes a phase-locked loop circuit including a voltage control oscillator for generating a primary clock signal; a frequency-dividing module disposed downstream of the phase-locked loop circuit for selectively frequency-dividing the primary clock signal according to a frequency-dividing condition so as to output the clock signal with the target frequency; and a self-test module coupled to the phase-locked loop circuit for determining a frequency limit of the primary clock signal; wherein the frequency-dividing condition is determined according to the frequency limit.

The present invention also relates to a self-test and switching-control method for use in a clock generator to output a clock signal with a target frequency. The clock generator includes a phase-locked loop circuit and a frequency-dividing module, and the method includes steps of: generating a primary clock signal by the phase-locked loop circuit; determining a frequency limit of the primary clock signal; and determining a frequency-dividing condition of the frequency-dividing module according to the frequency limit and the target frequency.

The present invention further relates a self-test method for use in a clock generator. The clock generator comprising a voltage control oscillator and a frequency-dividing module, and the method includes steps of: generating a primary clock signal by the voltage control oscillator; determining a frequency limit of the primary clock signal; and determining whether the voltage control oscillator works normally according to according to the frequency limit.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF THE PREFERRED EMBODIMENT

Figure 1:
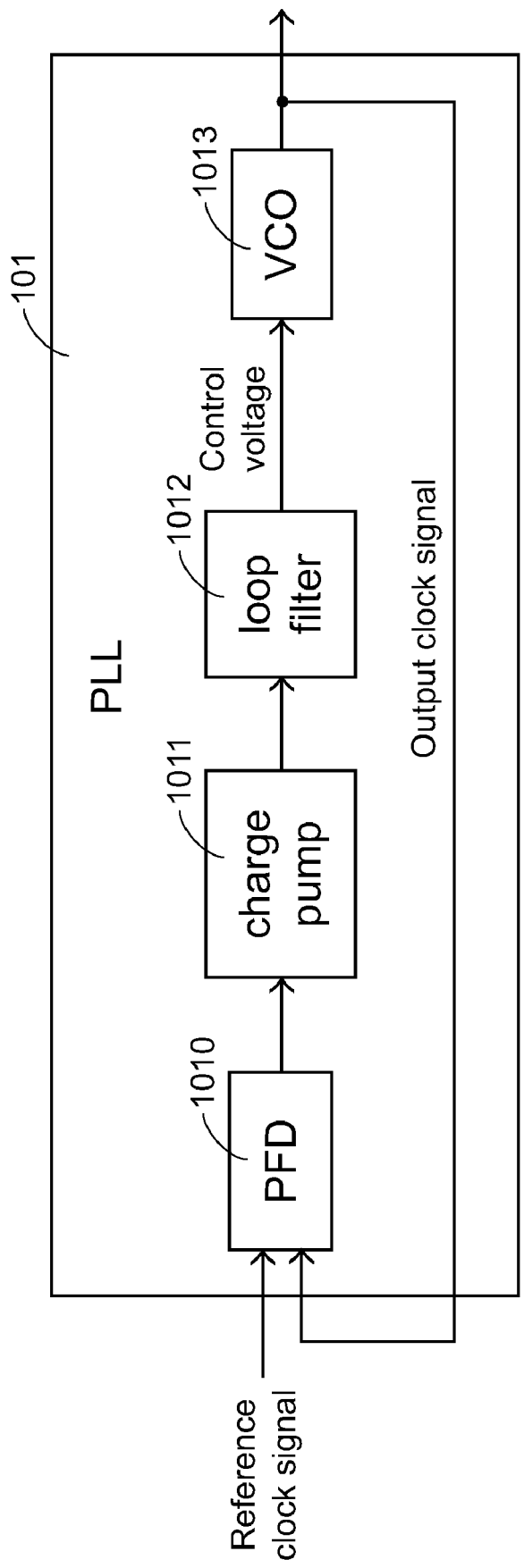
FIG. 1 is a block diagram of a conventional PLL circuit.
Figure 2:
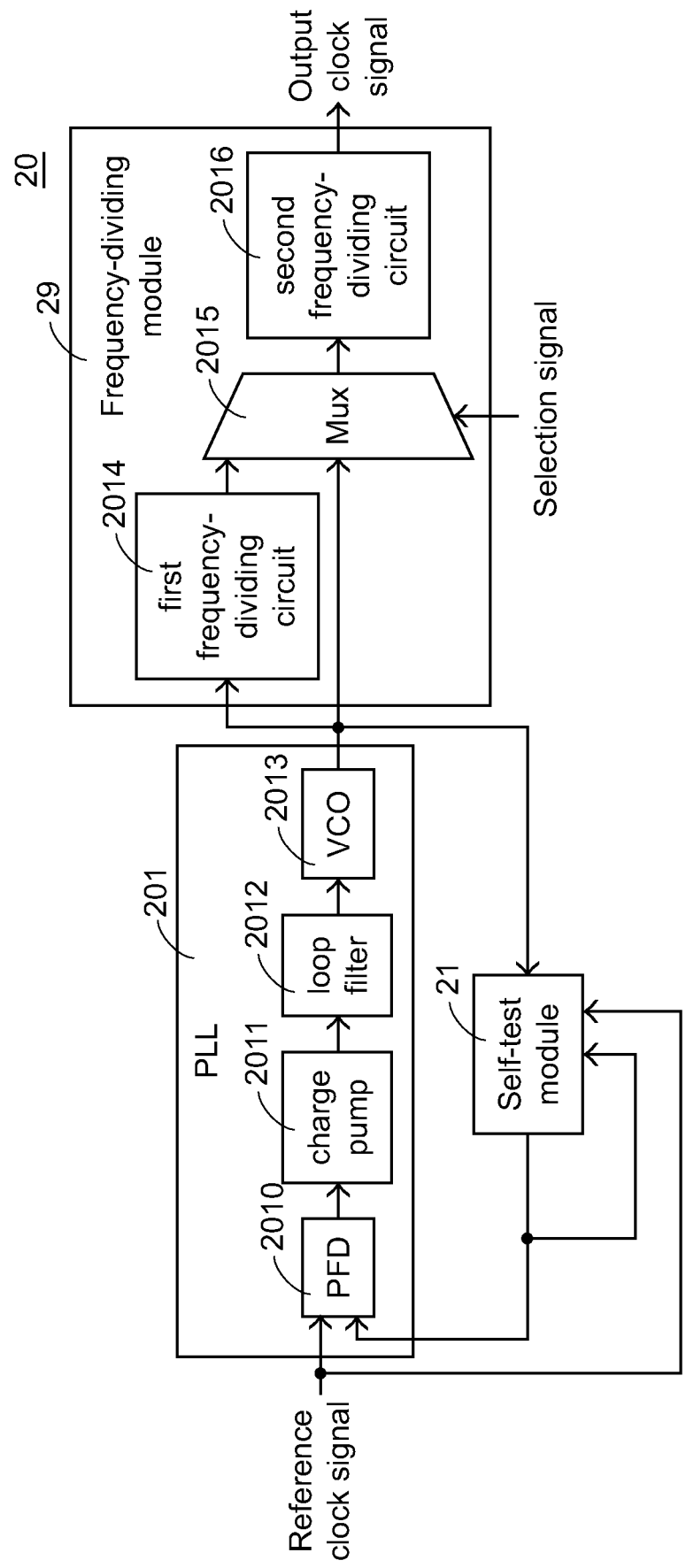
FIG. 2 is a block diagram of a clock generator according to an embodiment of the present invention.

Please refer to FIG. 2. A clock generator 20 according to an embodiment of the present invention includes a phase-locked loop (PLL) circuit 201 comprising a phase/frequency detector (PFD) 2010, a charge pump 2011, a loop filter 2012 and a single voltage control oscillator (VCO) 2013. Assume the VCO 2013 has an operational frequency ranged between 2150 MHz and 4300 MHz. In order that the clock generator 20 is able to cover a wide tuning range, e.g. 950~2150 MHz for a digital television, a frequency-dividing module 29, for example, including a first frequency-dividing circuit 2014, a multiplexer 2015 and a second frequency-dividing circuit 2016 is arranged downstream of the VCO 2013 for selectively adjusting the frequency. In this embodiment, the first frequency-dividing circuit 2014 and the second frequency-dividing circuit 2016 are both divided-by-2 circuits as examples. It is understood that more frequency-dividing circuits and other divisors can be used depending on practical applications. Through the first frequency-dividing circuit 2014, a first frequency-divided clock signal having a downward extending frequency ranged between 1075 MHz to 2150 MHz is obtained. The first frequency-divided clock signal, once selected via the multiplexer 2015, is further processed by the second frequency-dividing circuit 2016 to obtain a further downward extending frequency ranged between 537.5 MHz and 1075 MHz. In other words, the tuning range may cover the inherent operational frequency range 2150~4300 MHz of the VCO 2013 and the downward extending frequency ranges 1075~2150 MHz and 537.5~1075 MHz, i.e. overall 537.5~4300 MHz, with a single voltage control oscillator. Accordingly, the tuning range of the local oscillator of a digital television, e.g. 950~2150 MHz, can be achieved even though the operational frequency of the single VCO 2013 is ranged from 2150 to 4300 MHz.

Depending on the required frequency range, the output of the first frequency-dividing circuit 2014 is optionally selected by the multiplexer 2015 in response to a selection signal. For example, when the system requires a clock signal with a frequency of 1025 MHz that lies in the frequency range of 537.5~1075 MHz, the system commands to switch the connection state of the multiplexer 2015 via a selection signal so that the multiplexer 2015 selects the output from the first frequency-dividing circuit 2014. Therefore, with the second frequency-dividing circuit 2016 in series, a divided-by-4 operation is provided and the 1025 MHz clock signal can be obtained.

The above clock generator, although having an extended tuning range, may still suffer from unstable frequency. Practically, the signal frequency generated by a VCO in a chip may deviate up to 15% due to semiconductor manufacturing processes. The unpredicted upper limit and lower limit of the frequency range often renders system errors or fails the chips. Therefore, referring again to the above example, if the upper limit of the frequency generated by the VCO 2013 is actually only 4000 MHz instead of ideally 4300 MHz, the required frequency 1025 MHz cannot be obtained by the divided-by-4 operation any more since the divided-by-4 operation results in a frequency only up to 1000 MHz. For compensating the process deviation, the present invention performs a self-test procedure to realize the actual upper and/or lower limits first.

In this embodiment 2, a self-test module 21 is provided. Whenever system-booting, user's triggering and/or dramatic temperature-variation situations occur, a self-test procedure is automatically performed to update and store the upper and/or lower limits of the operating frequency range of the VCO 2013. Based on the actual upper and/or lower limits, the frequency of the output signal to the frequency-dividing module 29 can be accurately estimated. Accordingly, the switching condition between the first frequency-dividing circuit and the second frequency-dividing circuit can be precisely determined.

Figure 3:
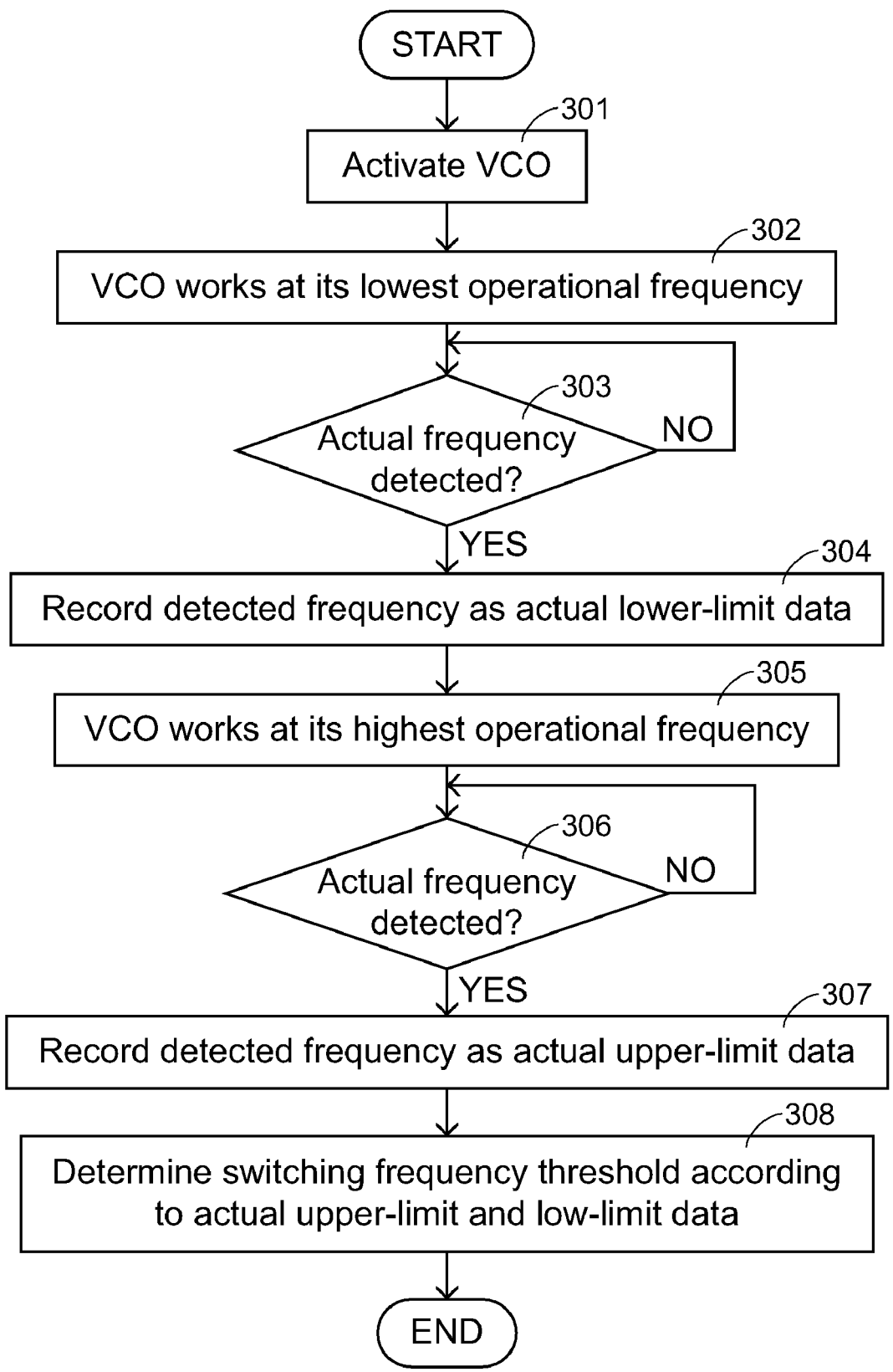
FIG. 3 is a flowchart of a self-test and switching-control method according to an embodiment of the present invention.

FIG. 3 illustrates a flowchart of a self-test and switching-control method associated with the clock generator 20 of FIG. 2. After the system boots, the VCO 2013 is activated (Step 301) and commanded to operate at its lowest operational frequency (Step 302). Detect the frequency of the output clock signal (Step 303), and record the detected frequency as an actual lower-limit data (Step 304). Subsequently, the VCO 2013 is band-switched to operate at its highest operational frequency (Step 305). Then detect and record the actual upper-limit data corresponding to the frequency of the clock signal obtained in Step 305 (Step 306 and Step 307). According to the actual upper-limit data and the actual lower-limit data, the switching condition, i.e. a threshold frequency for switching the multiplexer 2015, can be determined (Step 308).

Figure 4:
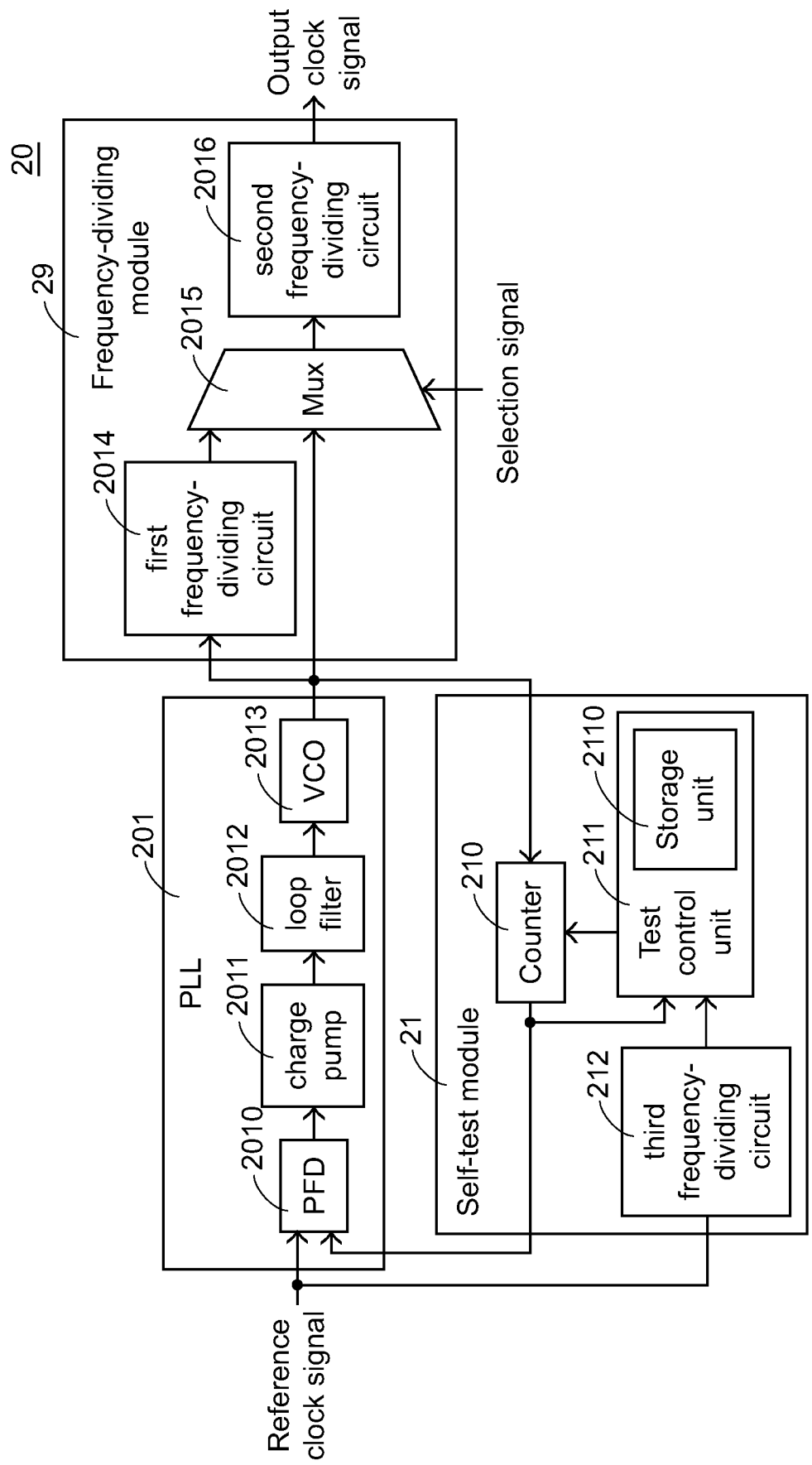
FIG. 4 is a block diagram of the clock generator of FIG. 2 with detailed circuitry of an embodiment of the self-test module.

In FIG. 4, the self-test module 21 includes a test control unit 211, a counter 210 and a third frequency-dividing circuit 212. In this embodiment, the test control unit 211 generates and outputs a divisor value to the counter 210 according to a lookup table. The counter 210 outputs a counting value based on the divisor value while the VCO 2013 is working at its highest operational frequency or its lowest operational frequency. The output of the counter 210 is then compared with a third frequency-divided clock signal generated by the third frequency-dividing circuit 212, to determine the actual upper limit and/or lower limit.

For example, the lookup table is exemplified as the following Table 1 to describe the embodiment of FIG. 4.

TABLE 1

| Upper-limit Bits | High-frequency Zone | | | Lower-limit Bits | Low-frequency Zone | | |
| --- | --- | --- | --- | --- | --- | --- | --- |
| | Divisor | Adiv | Bdiv | | Divisor | Adiv | Bdiv |
| 000 | 2000 | 250 | 0 | 000 | 1250 | 156 | 2 |
| 001 | 2050 | 256 | 2 | 001 | 1200 | 150 | 0 |
| 010 | 2100 | 262 | 4 | 010 | 1150 | 143 | 6 |
| 011 | 2150 | 268 | 6 | 011 | 1100 | 137 | 4 |
| 100 | 2200 | 275 | 0 | 100 | 1050 | 131 | 2 |
| 101 | 2250 | 281 | 2 | 101 | 1000 | 125 | 0 |
| 110 | 2300 | 287 | 4 | 110 | 950 | 118 | 2 |
| 111 | 2350 | 293 | 6 | 111 | 900 | 112 | 4 |

Assume the frequency of the reference clock signal generated by a crystal oscillator is precisely 4 MHz. Through the third frequency-dividing unit 212 which, for example, performs a divided-by-2 operation, the third frequency-divided clock signal with a frequency 2 MHz is obtained and sent to the test control unit 211. The VCO 2013 initially works at its highest operational frequency, which intends to cover 4300 MHz but actually unknown. Meanwhile, the test control unit 211 sequentially loads the digital values Adiv and Bdiv into the counter 210 to program the divisor values, wherein, in this embodiment, Bdiv indicates three least significant bits of the divisor value and Adiv indicates the other most significant bits of the divisor value. For example, if Adiv=250 and Bdiv=0, the divisor value is equal to $250*2^3+0=2000$; if Adiv=256 and Bdiv=2, the divisor value is equal to $256*2^3+2=2050$; and so on. Once the divisor value is determined, the counter 210 outputs a sampling signal as counting up from 0 to the divisor value. In response to the sampling signal, the test-control unit 211 performs a sampling operation of the third frequency-divided clock signal, which will be later described in more detail with reference to FIG. 5. The sampling operation starts from the smallest divisor value in the lookup table, i.e. 2000 for the high-frequency zone, and operates in response to two successive rising edges of the third frequency-divided clock signal. Accordingly, the actual upper limit can be determined. Likewise, by performing a similar sampling operation in the low frequency zone with the VCO initially works at its lowest operational frequency, the actual lower limit can be determined. The bits representing the divisor values corresponding to the actual upper and lower limits are stored in a storage unit 2110 of the test control unit 211.

Figure 5:
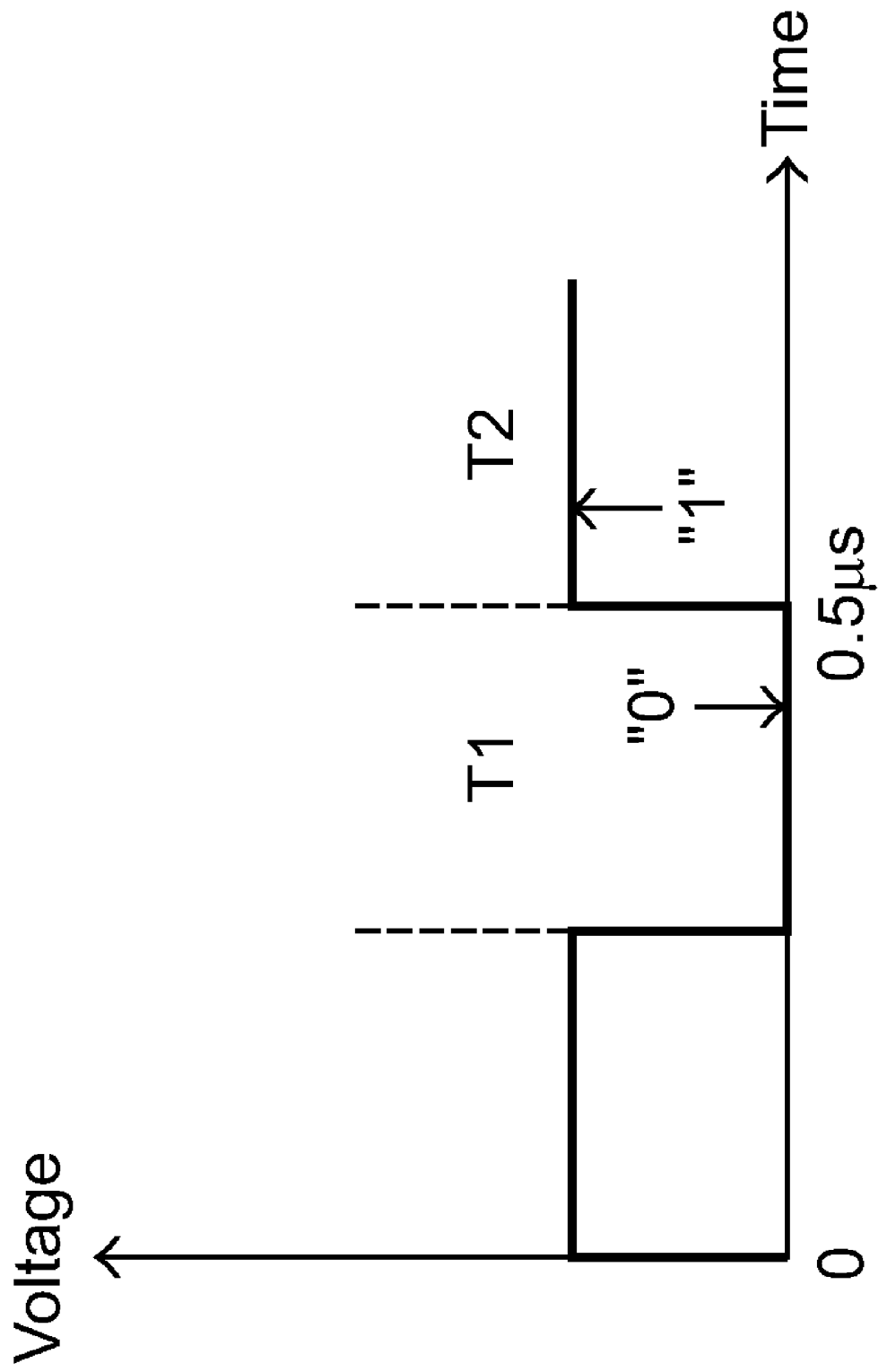
FIG. 5 is a timing-sequence plot schematically showing sampling points in a self-test and switching-control method according to an embodiment of the present invention.

Please refer to FIG. 5 wherein the period of the third frequency-divided clock signal between two successive rising edges is 0.5 μs as the frequency of the third frequency-divided clock signal is 2 MHz, and further refer to Table 1. Depending on different divisor values, the counter outputs a sampling signal at different time points, and a sampling operation is performed by the test control unit 211 in response to the sampling signal. For obtaining the actual upper limit of frequency outputted by the VCO, the sampling operation starts from the divisor value 2000. When the sampling point lies in the T1 zone, i.e. the sampled value is "0", for the divisor value 2000, it is indicated that the actual frequency generated by the VCO 2013 is higher than a frequency associate with the divisor value 2000, i.e. 4000 MHz. Afterwards, Adiv=256 and Bdiv=2 are loaded into the counter to result in next least divisor value 2050, and a sampling operation is performed accordingly. If the sampled value is still "0", it is indicated that the actual upper limit is still higher than a frequency associated with the divisor value 2050, i.e. 4100 MHz, and thus proceed to next least divisor value, i.e. 2100. The sampling operation is repetitively performed with increasing divisor values until the occurrence of a sampled value "1", i.e. the sampling point lies in the T2 zone, which means the actual frequency generated by the VCO 2013 is lower than a frequency associated with the current divisor value. Assume the sampled value "1" occurs when the divisor value is 2100. In this embodiment, the frequency corresponding to the last divisor value operated before the transition of the sampled value from "0" to "1" is determined to be the actual upper limit. Since the last divisor value is 2050, the actual upper limit is determined to be 4100 MHz. Meanwhile, the bits "001" corresponding to the divisor value 2050 are stored into the storage unit 2110.

On the other hand, the divisor values in the low-frequency zone of the lookup table can be used to determine the actual lower limit in a similar way, except that the sampling operation starts from the greatest divisor value, i.e. 1250, and the transition state for ending the sampling operation is from logic "1" to "logic "0". Likewise, the last divisor value operated before the transition of the sampled value from "1" to "0" is determined to be the actual lower limit. For example, if all the divisor values 1250, 1200, 1150 and 1100 result in the sampled value "1" and the divisor value 1050 results in the sampled value "0", the last divisor value operated before the transition of the sampled value from "1" to "0" is 1100. Therefore, the actual lower limit is determined to be 2200 MHz corresponding to the divisor value 1100. The bits "011" corresponding to the divisor value 1100 are also stored into the storage unit 2110. The bits "001" and "011" stored in the storage unit 2110 can be read out by the system via an I2C bus.

An alternative embodiment of self-test and switching-control method can be performed with the architecture of the self-test module 21 of FIG. 4. In this embodiment, the third frequency-divided clock signal is provided for the test control unit 211 as a reference, and a counting value of the counter 210, which is counted in response to the frequency of the VCO 2013, is detected in response to the third frequency-divided clock signal. As the frequency of the third frequency-divided clock signal is stably 2 MHz, the period between two successive rising edges is 0.5 μs. The accumulative counting value of the counter 210 during the 0.5 μs period is detected while the VCO is working at its highest operational frequency, thereby obtaining an upper-limit counting value. The upper-limit counting value is then compared with a plurality of threshold values, e.g. the divisor values in Table 1, to locate one of the threshold values, which is closest to the upper-limit counting value. As a result, a frequency corresponding to the located threshold value will be determined as the actual upper limit frequency generated by the VCO 2013. Likewise, the actual lower limit frequency generated by the VCO 2013 can also be determined by detecting the accumulative counting value of the counter 210 between two successive rising edges while the VCO is working at its lowest operational frequency to obtain a low-limit counting value. According to the low-limit counting value and the threshold values, the actual lower limit frequency can be determined. Store the bits representing the actual upper and lower limits in the storage unit 2110.

After the actual upper limit frequency and lower limit frequency are determined and stored, the system may determine a practically proper switching condition for selecting the divided-by-2 path or the divided-by-4 path via the multiplexer 2015 in FIG. 4 accordingly. The switching condition may include the upper-limit threshold or the low-limit threshold, or both, depending on practical applications. For example, if the actual upper-limit frequency is determined to be less than 4000 MHz in the above-described examples, the VCO 2013 is considered defective and should be discarded. Therefore, there is no need further testing the lower limit frequency.

In view of the foregoing, by applying a frequency-dividing module, a clock generator may reduce the quantity of VCOs. Preferably, a single VCO can precisely cover a wide tuning range. Furthermore, by way of the self-test and switching-control of the present invention, the frequency drift of the VCO in the clock generator can be compensated. Further, the self-test and switching-control of the present invention can screen out a defective VCO if the actual upper or lower limit frequency of the VCO is beyond a reasonable range.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A clock generator for generating a clock signal with a target frequency, comprising:
   a phase-locked loop circuit including a voltage control oscillator for generating a primary clock signal;
   a frequency-dividing module disposed external to a feedback loop associated with the phase-locked loop circuit for selectively frequency-dividing the primary clock signal according to a frequency-dividing condition so as to output the clock signal with the target frequency; and
   a self-test module coupled to the phase-locked loop circuit for determining a frequency limit of the primary clock signal;
   wherein the frequency-dividing condition is determined according to the frequency limit.

2. The clock generator according to claim 1 wherein the frequency-dividing condition is one of a plurality of divisors to frequency-divide the primary clock signal.

3. The clock generator according to claim 1 wherein the frequency-dividing condition is determined according to the target frequency and the frequency limit.

4. The clock generator according to claim 1 wherein the frequency-dividing module includes:
   a first frequency-dividing circuit coupled to the voltage control oscillator for frequency-dividing the primary clock signal to generate a frequency-divided clock signal;
   a multiplexer coupled to the voltage control oscillator and the first frequency-dividing circuit for selecting one of the frequency-divided clock signal and the primary clock signal to be outputted according to the frequency-dividing condition; and
   a second frequency-dividing circuit coupled to the multiplexer for frequency-dividing the output of the multiplexer to generate the clock signal with the target frequency.

5. The clock generator according to claim 1 wherein the self-test module includes:
   a counter coupled to the voltage control oscillator, accumulatively counting in response to the primary clock signal, and generating a sampling signal when a counting value matches a specified divisor value;
   a third frequency-dividing circuit for receiving and frequency-dividing a reference clock signal supplied to the phase-locked loop circuit to generate a third frequency-divided clock signal; and
   a test control unit coupled to the counter and the third frequency-dividing circuit, providing the specified divisor value for the counter, and sampling the third frequency-divided clock signal in response to the sampling signal.

6. The clock generator according to claim 5 wherein the test control unit includes a lookup table, and sequentially loads a plurality of divisor values to the counter according to the lookup table so that the counter sequentially outputs a plurality of sampling signals corresponding to the divisor values, and the test control unit samples the third frequency-divided clock signal in response to the sampling signals and determines the frequency limit of the primary clock signal according to the sampling results.

7. The clock generator according to claim 5 wherein the test control unit includes a storage unit for storing the frequency limit.

8. The clock generator according to claim 1 wherein the frequency limit is an upper limit and/or a lower limit of the frequency of the primary clock signal.

9. The clock generator according to claim 1 wherein the phase-locked loop circuit includes a phase/frequency detector, a charge pump, a loop filter and the voltage control oscillator.

10. The clock generator according to claim 1 wherein the self-test module includes:
   a third frequency-dividing circuit for receiving and frequency-dividing a reference clock signal supplied to the phase-locked loop circuit to generate a third frequency-divided clock signal;
   a counter coupled to the voltage control oscillator, accumulatively counting in response to the primary clock signal, and starting and ending a counting operation at the occurrences of two successive rising edges of the third frequency-divided clock signal, respectively, to generate a counting value; and
   a test control unit coupled to the counter and the third frequency-dividing circuit, and comparing the counting value with a plurality of preset threshold values to determine the frequency limit.

11. A self-test and switching-control method for use in a clock generator to output a clock signal with a target frequency, the clock generator comprising a phase-locked loop circuit and a frequency-dividing module disposed external to a feedback loop associated with the phase-locked loop circuit, and the method comprising steps of:
   generating a primary clock signal by the phase-locked loop circuit;
   determining a frequency limit of the primary clock signal; and
   determining a frequency-dividing condition of the frequency-dividing module according to the frequency limit and the target frequency.

12. The method according to claim 11 wherein the primary clock signal is generated by a single voltage control oscillator in response to a reference clock signal.

13. The method according to claim 12 wherein the steps of determining the frequency limit of the primary clock signal includes steps of:
   frequency-dividing the reference clock signal to generate a frequency-divided clock signal;
   counting a counting value in response to the primary clock signal;
   asserting a sampling signal according to the counting value and a divisor value; and
   sampling the frequency-divided clock signal in response to the sampling signal to obtain a sampling value to determine the frequency limit of the primary clock signal.

14. The method according to claim 12 wherein the steps of determining the frequency limit of the primary clock signal includes steps of:
   a) frequency-dividing the reference clock signal to generate a frequency-divided clock signal;
   b) performing a counting operation in response to the primary clock signal to obtain a counting value;
   c) outputting a sampling signal according to the counting value and a divisor value;
   d) sampling the frequency-divided clock signal in response to the sampling signal to obtain a sampling value;
   e) repeating the steps b)~e) with a different divisor value when the sampling value obtained in the step d) complies with a preset condition;
   f) locating the last divisor value resulting in a sampling value complying with the preset condition; and
   g) determining a frequency corresponding to the last divisor value as the frequency limit.

15. The method according to claim 12 wherein the steps of determining the frequency limit of the primary clock signal includes steps of:
   frequency-dividing the reference clock signal to generate a frequency-divided clock signal;
   counting a counting value according to the primary clock signal, in response to two successive rising edges of the frequency-divided clock signal; and
   comparing the counting value with a plurality of threshold values to determine the frequency limit of the primary clock signal.

16. The method according to claim 11 wherein the primary clock signal is obtained by having a voltage control oscillator of the phase-locked loop circuit operate at a limit operational frequency.

17. The method according to claim 16 wherein the limit operational frequency is the highest operational frequency of the voltage control oscillator when the frequency limit to be determined is an upper limit, and the limit operational frequency is the lowest operational frequency of the voltage control oscillator when the frequency limit to be determined is a lower limit.

* * * * *